United States Patent
Cha et al.

(10) Patent No.: US 6,303,418 B1
(45) Date of Patent: Oct. 16, 2001

(54) METHOD OF FABRICATING CMOS DEVICES FEATURING DUAL GATE STRUCTURES AND A HIGH DIELECTRIC CONSTANT GATE INSULATOR LAYER

(75) Inventors: Cher Liang Cha; Alex See, both of Singapore (SG); Lap Chan, SF, CA (US)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/607,282

(22) Filed: Jun. 30, 2000

(51) Int. Cl.7 .................................................. H01L 21/8238
(52) U.S. Cl. .......................... 438/199; 438/216; 438/218; 438/221; 438/229; 438/230; 438/231; 438/233; 438/585; 438/588; 438/591; 438/592; 438/595
(58) Field of Search .................................. 438/199, 216, 438/218, 221, 229, 230, 231, 233, 585, 588, 591, 592, 595

(56) References Cited

U.S. PATENT DOCUMENTS

| | | | |
|---|---|---|---|
| 5,112,765 | 5/1992 | Cederbaum et al. | 437/41 |
| 5,480,830 | 1/1996 | Liao et al. | 437/58 |
| 5,731,239 | 3/1998 | Wong et al. | 438/296 |
| 5,960,270 | 9/1999 | Misra et al. | 438/197 |
| 5,966,597 | 10/1999 | Wright | 438/197 |
| 6,033,963 | 3/2000 | Huang et al. | 438/303 |
| 6,200,866 | * 3/2001 | Ma et al. | 438/299 |

* cited by examiner

*Primary Examiner*—Charles Bowers
*Assistant Examiner*—Lynne Gurley
(74) *Attorney, Agent, or Firm*—George O. Saile; Rosemary L. S. Pike

(57) ABSTRACT

A method of forming a metal gate structure, on a high k gate insulator layer, for NMOS devices, and simultaneously forming a metal-polysilicon gate structure, on the same high k gate insulator layer, for PMOS devices, has been developed. The method features forming openings in a composite insulator layer, via removal of silicon nitride dummy gate structures that were embedded in a composite insulator layer, with the openings exposing regions of the semiconductor substrate to be used for subsequent NMOS and PMOS channel regions. Deposition of a high k gate insulator layer is followed by deposition of an in situ doped polysilicon layer. After removal of a portion of the in situ doped polysilicon layer located in the NMOS region, a metal layer is deposited on the underlying high k gate insulator layer in the NMOS region, and on the in situ polysilicon layer in the PMOS region. Removal of unwanted regions of metal, and of in situ polysilicon, result in the definition of a metal gate structure, on the high k gate insulator layer, in the NMOS region, and in the definition of a metal—in situ doped polysilicon gate structure, on the high k gate insulator layer, in the PMOS region, with both gate structures embedded in openings in the composite insulator layer, previously formed via removal of the silicon nitride dummy gate structures.

28 Claims, 5 Drawing Sheets

_US 6,303,418 B1_

METHOD OF FABRICATING CMOS DEVICES FEATURING DUAL GATE STRUCTURES AND A HIGH DIELECTRIC CONSTANT GATE INSULATOR LAYER

BACKGROUND OF THE INVENTION (1) Field of the Invention

The present invention relates to methods used to fabricate semiconductor devices, and more specifically to a method used to fabricate complementary metal oxide semiconductor, (CMOS), device, featuring dual gate structures, such as a metal gate as well as a metal-polysilicon gate, on an underlying high dielectric constant, (high k), gate insulator layer.

(2) Description of Prior Art

Integrated circuit, (IC), technology has progressed to the point in which two different gate insulator thicknesses have been used to create CMOS devices with two different threshold voltages, allowing different, desired operating voltages to be realized for each CMOS device. Subsequent CMOS development featured gate structures, each comprised of a specific metal, on an underlying high k gate insulator, with each CMOS device resulting in a specific threshold, or operating voltage, realized via the difference in work function supplied by each specific metal. However the use of two different metal gate structures results in an increase in process complexity, as well as an increase in fabrication costs. In addition the use of polysilicon gate structures, on various thicknesses of underlying gate insulator layer, can result in CMOS device depletion effects resulting especially from N type implanted, polysilicon gate structures, when formed on thin silicon dioxide gate insulator layers.

This invention will describe a novel fabrication procedure for CMOS devices, in which dual gate structures, a metal gate, as well as a metal-polysilicon gate structure, are formed on an underlying high k gate insulator layer, resulting in a specific threshold voltage for each specific gate structure. Prior art, such as Liao et al, in U.S. Pat. No. 5,480,839, describe a method of fabricating CMOS devices that operate at different voltages, resulting from the use of doped, as well as undoped, polysilicon gate structures. However that prior art does not describe the unique process sequence of the present invention, in which metal gate structures, as well as metal-polysilicon gate structures, are formed on an underlying, thin high k gate insulator layer allowing a specific operating voltage to be realized for a CMOS device, as a function of structure type.

SUMMARY OF THE INVENTION

It is an object of this invention to fabricate CMOS devices on a semiconductor substrate, featuring a first set of CMOS devices, operating at a first voltage, and featuring a second set of CMOS devices, operating at a second voltage.

It is another object of this invention to use a high k gate insulator layer for both the first set, and the second set of CMOS devices.

It is still another object of this invention to form metal-polysilicon gate structures for the first set of CMOS devices, while using metal gate structures for the second set of CMOS devices.

It is still yet another object of this invention to simplify the whole process of making dual gate CMOS devices In accordance with the present invention of a method of fabricating a first set of CMOS devices, designed to operate at a first voltage, and fabricating a second set of CMOS devices, designed to operate at a second voltage, is described. Silicon nitride, dummy gate structures are formed in a first region of a semiconductor substrate, to be used for a P channel, (PMOS), CMOS devices, and silicon nitride dummy gate structures are also formed in a second region of the semiconductor substrate, to be used for an N channel, (NMOS), CMOS devices. After formation of P type, lightly doped source/drain, (LDD) regions, insulator sidewall spacers, and P type, heavily doped source/drain region, in the first region, or PMOS region of the semiconductor substrate, N type LDD regions, insulator sidewall spacers, and N type, heavily doped source/drain regions are formed in the second region, or NMOS region of the semiconductor substrate. Deposition of a composite insulator layer is followed by a chemical mechanical polishing, (CMP), procedure, resulting in exposure of the top surface of the silicon nitride dummy gate structures, embedded in the composite insulator layer. After selective removal of the silicon nitride dummy gate structures, a high k gate insulator layer is deposited, followed by the deposition of an in situ doped, polysilicon layer. Photolithographic, and wet etching procedures are used to remove polysilicon from the top surface of the high k gate insulator layer, in the second, or NMOS region, still leaving polysilicon on the high k gate insulator layer, in the first, or PMOS region. Deposition of a metal layer, on polysilicon, fills the space vacated by the silicon nitride dummy structures, in the PMOS region, while the same metal deposition fills the space vacated by the silicon nitride dummy gate structures, in the NMOS region. Another CMP procedure removes the metal layer from the top surface of the high k layer in a region in which the high k layer resided on the top surface of the composite insulator layer, resulting in: metal-polysilicon gate structures on the high k gate insulator layer, embedded in the composite insulator layer in a first, or PMOS region of the semiconductor substrate, and metal gate structures on the high k gate insulator layer, embedded in the composite insulator layer in a second, or NMOS region of the semiconductor substrate.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

The method of forming a first set of CMOS devices, featuring metal-polysilicon gate structures, on a high k gate insulator layer, and simultaneously forming a second set of CMOS devices, featuring metal gate structures on the high k gate insulator layer, will now be described in detail. This invention will be described using the metal-polysilicon gate structures for PMOS devices, while showing metal gate structures in an NMOS region, however it should be understood that metal-polysilicon gate structures, as well as metal gate structures, can be employed in either type of CMOS type.

Figure 1:
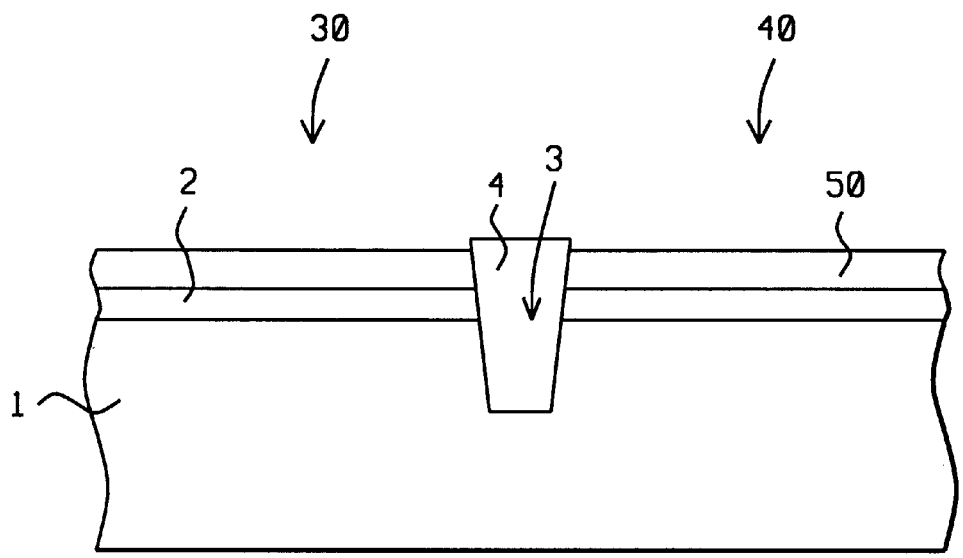
FIGS. 1–9, which schematically, in cross-sectional style show key stages of fabrication used to form a first set of CMOS devices, featuring metal-polysilicon gate structures, and used to form a second set of CMOS devices, featuring metal gate structures.

A P type, semiconductor substrate 1, comprised of single crystalline silicon, with a <100> crystallographic orientation, is used and schematically shown in FIG. 1.

Region 30, of semiconductor substrate 1, will be used for PMOS devices, featuring metal-polysilicon gate structures, while region 40, of semiconductor substrate 1, will be used for the NMOS devices, fabricated with metal gate structures. A silicon oxide layer 2, is formed on semiconductor substrate 1, either via thermal oxidation, or via plasma enhanced chemical vapor deposition, (PECVD), procedures, at a thickness between about 100 to 200 Angstroms, followed by chemical vapor deposition of silicon nitride layer 50, at a thickness between about 2000 to 4000 Angstroms. Conventional photolithographic and reactive ion etching, (RIE), procedures, using $CHF_3$ as an etchant for silicon nitride layer 50, and for silicon oxide layer 2, and using $Cl_2$ or $SF_6$ as an etchant for silicon, are used to for define shallow trench shape 3, at a depth between about 3000 to 4000 Angstroms, in semiconductor substrate 1. Silicon oxide layer 4, is next deposited via low pressure chemical vapor deposition, (LPCVD), procedures, to a thickness between about 6000 to 8000 Angstroms, completely filling shallow trench shape 3. A chemical mechanical polishing, (CMP), procedure is next employed to remove regions of silicon oxide layer 4, from the top surface of silicon nitride layer 50, with the CMP procedure terminating on silicon nitride layer 50. This is schematically shown in FIG. 1.

Figure 2:
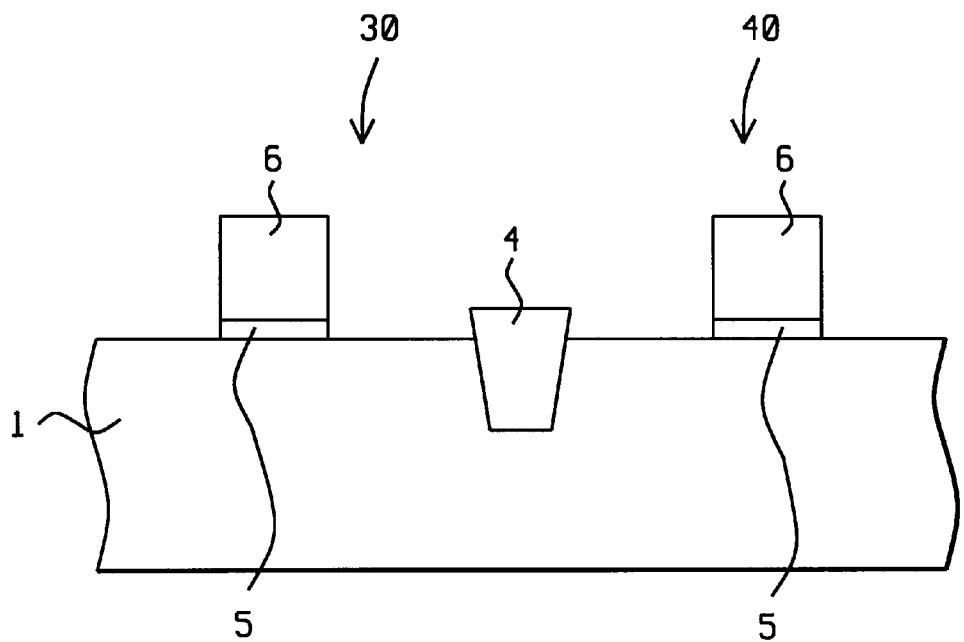

After removal of silicon nitride layer 50, via use of a hot phosphoric acid solution, a buffered hydrofluoric, (BHF), acid, wet etch procedure is used to remove silicon oxide layer 2, from the top surface of semiconductor substrate 1. The BHF procedure removes the less dense PECVD silicon oxide layer 2, at a faster removal rate than the denser LPCVD silicon oxide layer 4, resulting in the raised, insulator filled, shallow trench shape, shown schematically in FIG. 2. A silicon oxide layer is next formed to a thickness between about 100 to 200 Angstroms, via thermal oxidation, PECVD or LPCVD procedures, followed by the deposition of a silicon nitride layer, via LPCVD or PECVD procedures, at a thickness between about 2000 to 3000 Angstroms. Conventional photolithographic and anisotropic RIE procedures, using $Cl_2$ or $CF_4$ as an etchant for silicon nitride, while using $CHF_3$ as an etchant for silicon oxide, are next performed resulting in silicon nitride dummy gate structures 6, on silicon oxide dummy gate insulator layer 5, in both region 30, and region 40. Silicon nitride dummy gate structures, which will subsequently define CMOS channel regions, are formed with a width between about 0.10 to 0.15 um. Removal of the photoresist shapes used for definition of the dummy structures is accomplished via plasma oxygen ashing and careful wet cleans. The result of these procedures is schematically shown in FIG. 2.

Figure 3:
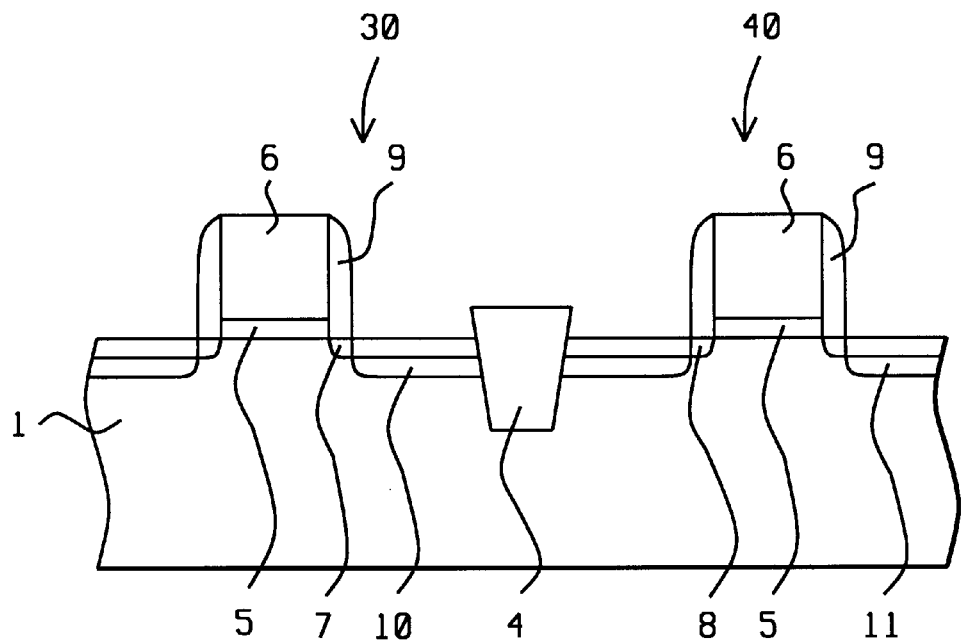

Region 30, and region 40, will next be subjected to the ion implantation procedures needed to form P type and N type, source/drain regions, shown schematically in FIG. 3. A photoresist block out shape, (not shown in the drawings), is use to protect NMOS region 40, from implantation of boron or $BF_2$ ions, at an energy between about 5 to 10 KeV, at a dose between about 2E14 to 1E15 atoms/$cm^2$, resulting in P type, LDD region 7. After removal of the photoresist shape used for definition of P type LDD region 7, via plasma oxygen ashing and careful wet cleans, another photoresist block shape, (not shown in the drawings), is used to protect PMOS region 30, from implantation of arsenic or phosphorous ions, at an energy between about 5 to 10 KeV, at a dose between about 5E14 to 1E15 atoms/$cm^2$, creating N type, LD region 8. The photoresist block out shape used for definition of N type LDD region 8, is removed via plasma oxygen ashing and careful wet cleans. A silicon oxide layer is next deposited via LPCVD or PECVD procedures, at a thickness between about 600 to 800 Angstroms, then subjected to an anisotropic RIE procedure, using $CHF_3$ as an etchant, forming silicon oxide spacers 9, on the sides of silicon nitride dummy gate structures 6. This is schematically shown in FIG. 3. Another photoresist block out shape, (not shown in the drawings), is again used to protect NMOS region 40, from implantation of boron or $BF_2$, at an energy between about 25 to 30 KeV, at a dose between about 5E15 to 1E16 atoms/$cm^2$, creating P type, heavily doped source/drain region 10, shown schematically in FIG. 3. After removal of the photoresist block shape used to define P type heavily doped source/drain region 10, via plasma oxygen ashing and careful wet cleans, a photoresist block out shape, (not shown in the drawings), is again used to protect PMOS region 30, from implantation of arsenic or phosphorous ions, at an energy between about 60 to 80 KeV, at a dose between about 5E15 to 1E16 atoms/$cm^2$, used to form N type, heavily doped source/drain region 11, in NMOS region 40. This is schematically shown in FIG. 3. The photoresist block out shape is again removed using plasma oxygen ashing and careful wet cleans.

Figure 4:
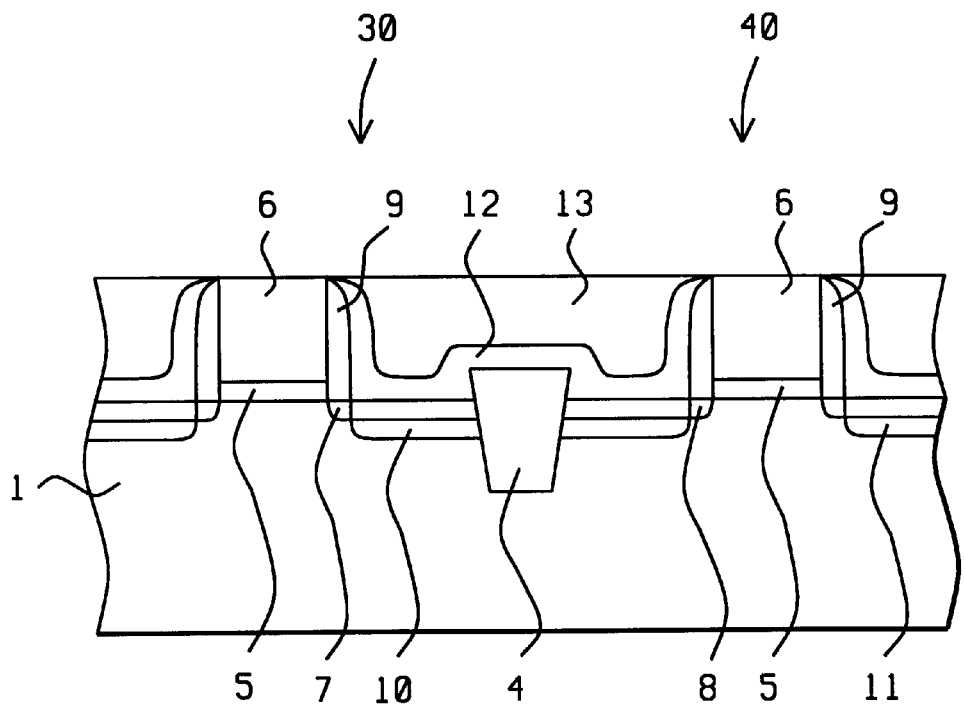
Figure 5:
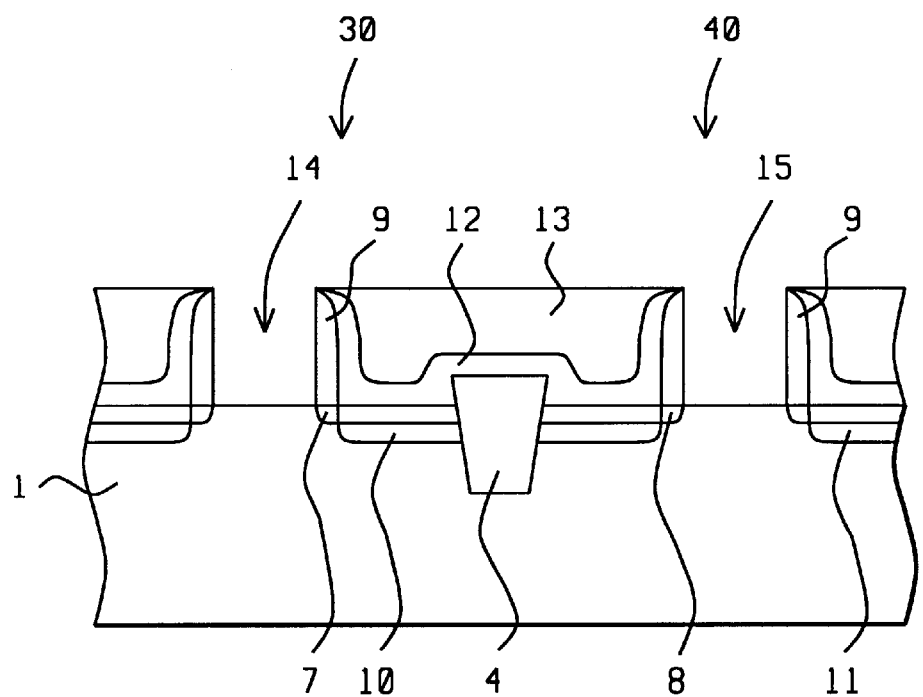

The formation of a composite insulator layer, embedding silicon nitride dummy gate structures is next addressed and schematically shown in FIG. 4. Silicon oxide liner layer 12, such as a silicon rich oxide, (SRO), layer, is first deposited via LPCVD or PECVD procedures, to a thickness between about 300 to 500 Angstroms, followed by the deposition of overlying insulator layer 13. Insulator layer 13, obtained via PECVD procedures, at a thickness between about 8000 to 10000 Angstroms, can be comprised of an underlying borophosphosilicate glass, (BPSG), layer, and an overlying fluorinated silica glass, (FSG), layer, or an overlying layer of any low k, flowable material. Insulator layer 13, completely fills the spaces between silicon nitride dummy gate structures 6. A chemical mechanical polishing, (CMP), is then employed for planarization purposes and to expose the top surface of silicon nitride dummy gate structures 6. This can be schematically sen in FIG. 4. Selective removal of the exposed silicon nitride dummy gate structures is then achieved via a wet etch procedure, using a hot phosphoric acid solution, which selectively removes silicon nitride without etching silicon oxide. This procedure is followed by a BHF dip, removing silicon oxide dummy gate insulator layer 5, now exposed with the removal of the overlying silicon nitride dummy gate structures, resulting in opening, or space 14, in PMOS region 30, and opening, or space 15, in NMOS region 40. The removal of thin silicon oxide dummy gate insulator layer 5, via a short exposure to a BHF solution, exposing subsequent channel regions for both PMOS and NMOS devices, does not result in significant attack or removal of exposed silicon oxide regions, such as silicon oxide spacers 9, or insulator layer 13. The result of these procedures is schematically shown in FIG. 5.

Figure 6:
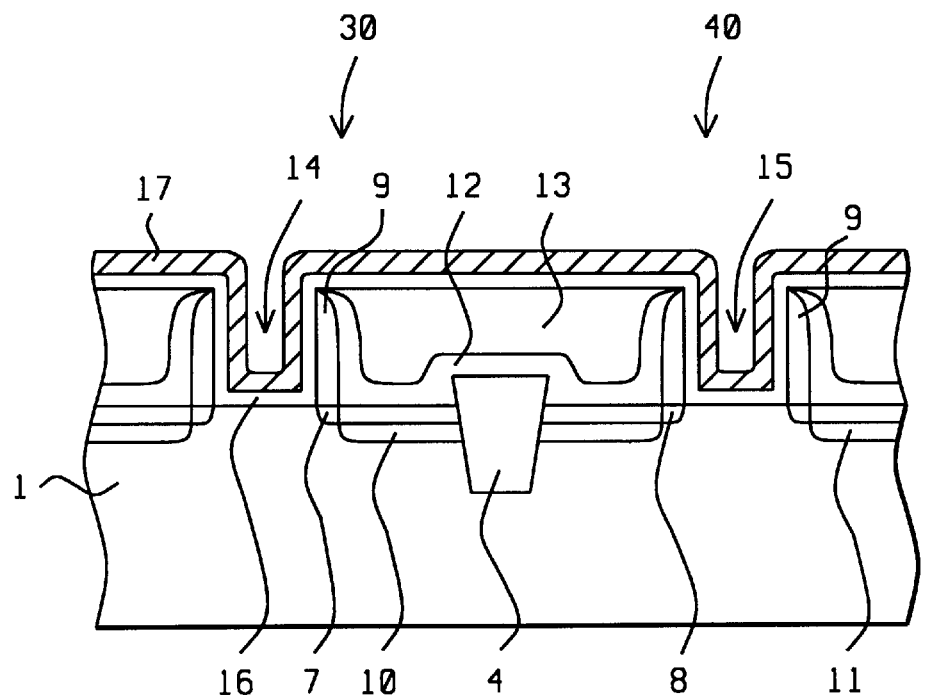

A high dielectric constant, (high k), transition metal oxide layer 16, comprised of a refractory metallic oxide, such as $Ta_2O_5$, or comprised of a nitrided oxide layer, is next deposited conformally via CVD procedures, at a thickness between about 200 to 400 Angstroms. High k layer 16, with a dielectric constant between about 5 to 22, interfacing the portion of semiconductor substrate 1, exposed at the bottom of opening 14, and opening 15, respectfully, will serve as the gate insulator layer for both PMOS and NMOS devices. This is schematically shown in FIG. 6. A polysilicon layer 17, is next deposited via LPCVD procedures, to a thickness between about 4000 to 5000 Angstroms. Polysilicon layer 17, shown schematically in FIG. 6, is doped in situ, during deposition via the addition of arsine or phosphine, to a silane ambient. The attainment of N type, polysilicon layer, via in situ deposition procedures, which allows over 90% of the dopants to be activated reduces the risk of depletion effects observed with counterpart, ion implanted N type, polysilicon layers, on underlying thin insulator layers.

Figure 7:
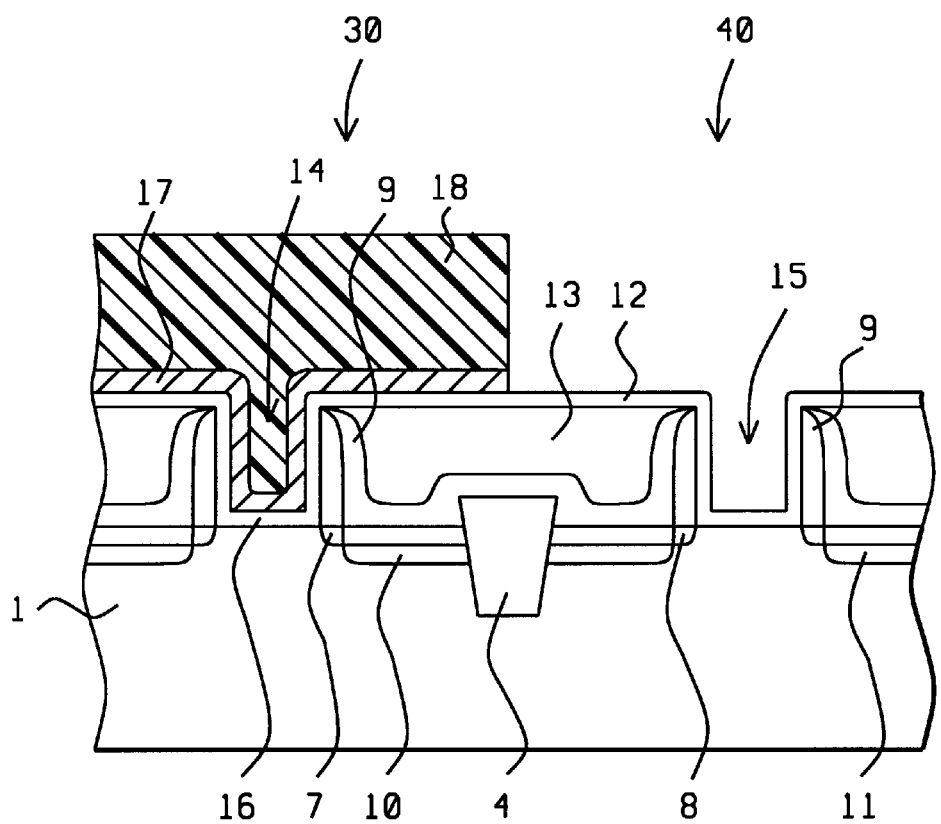

Photoresist shape 18, shown schematically in FIG. 7, is next used as an etch mask to allow exposed portions of polysilicon layer, in NMOS region 40, to be selectively removed via wet etch procedures, in a solution comprised of hot potassium hydroxide. The isotropic wet etch procedure allows removal of polysilicon layer 17, located on the sides of opening 15, which could not be accomplished using an anisotropic RIE procedure. In addition the selective wet etch procedure does not result in removal of exposed high k layer 16, in opening 15, preserving the integrity the high k layer for use as a gate insulator layer for subsequent NMOS devices. In addition this procedure also avoids exposure of the high k layer to plasma induced damage. Removal of photoresist shape 18, is again accomplished via plasma oxygen ashing and careful wet cleans.

Figure 8:
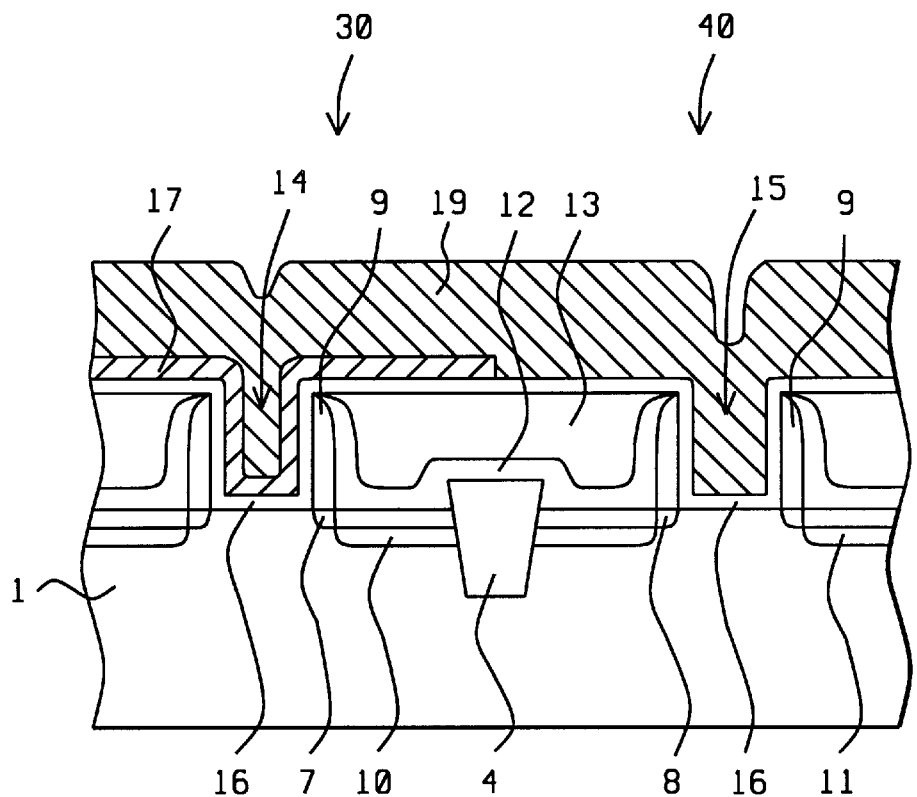
Figure 9:
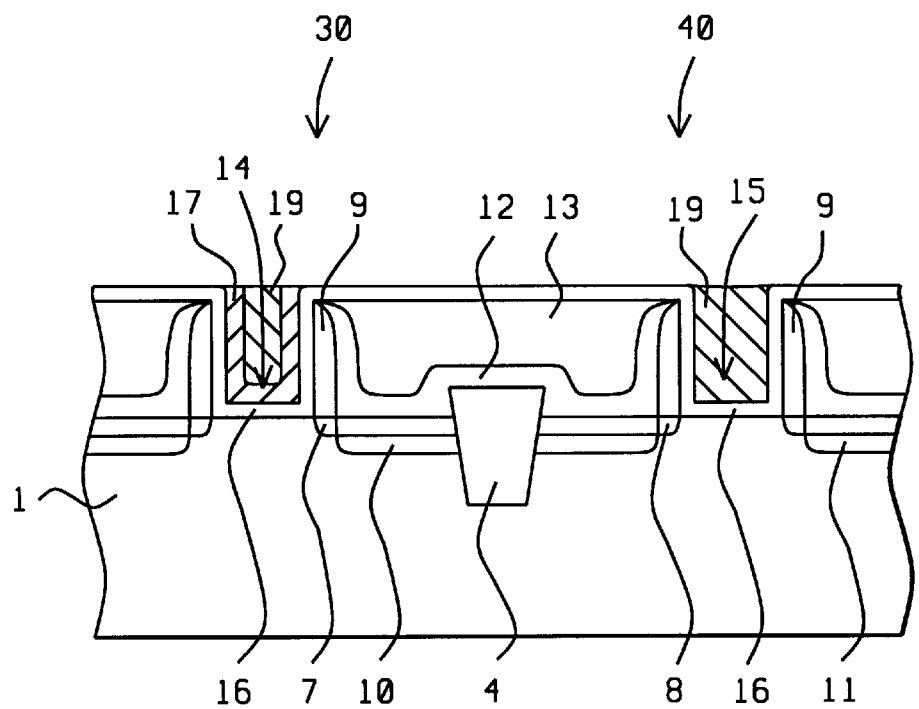

Metal layer 19, comprised of either aluminum, aluminum-copper, aluminum-copper-silicon, copper, or other transition metals, is next deposited via plasma vapor deposition, (PVD), procedures, to a thickness between about 4000 to 5000 Angstroms, completely filling opening 14, in PMOS region 30, and completely filling opening 15, in NMOS region 40. Metal layer 19, shown schematically in FIG. 8, overlays polysilicon layer 17, in opening 14, while overlaying high k layer 16, in opening 15. A CMP procedure is then employed to remove regions of metal layer 19, from the top surface of high k layer 16, in NMOS region 40, in the region in which high k layer 16, resided on the top surface of insulator layer 13. The same CMP procedure removes the region of metal layer 19, and the region of polysilicon layer 17, in PMOS region 30, from the top surface of high k layer 17, in the region in which high k layer 16, resided on the top surface of insulator layer 13. The result of the CMP procedure is the formation of a metal-polysilicon gate structure, comprised of metal layer 19, and underlying polysilicon layer 17, on high k, gate insulator layer 16, in PMOS region 30, embedded in insulator layers comprised with interfacing silicon oxide spacers 9. The CMP procedure also defines a metal gate structure, comprised of metal layer 19, on underlying high k gate insulator layer 16, in NMOS region 40. The use of a metal-polysilicon gate structure, on underlying high k gate insulator layer 16, allows a desired operating voltage to be used for devices in PMOS region 30, while the attainment of a metal gate structure, directly on high k gate insulator layer 16, allows a different, desired operating voltage to be used for the devices in NMOS region 40. If desired the gate structures can also be defined via selective removal of portions of metal layer 19, and portions of polysilicon layer 17, via selective RIE procedures, using $Cl_2$ or $SF_6$ as an etchant.

While this invention has been particularly shown and described with reference to, the preferred embodiments thereof, it will be understood by those skilled in the art that various changes in form and details may be made without departing from the spirit and scope of this invention.

What is claimed is:

1. A method of forming a first type gate structure, for a first type complimentary metal oxide semiconductor device, (CMOS), device, and simultaneously forming a second type gate structure, for a second type CMOS device, on a semiconductor substrate, comprising the steps of:

forming a first dummy gate structure on a first region of said semiconductor substrate, to be used for said first type CMOS device, and forming a second dummy gate structure on a second region of said semiconductor substrate, to be used for said second type CMOS device;

forming a first lightly doped source/drain region, of a first conductivity type, in an area of said first region of said semiconductor substrate not covered by said first dummy gate structure, and forming a second lightly doped source/drain region, of a second conductivity type, in an area of said second region of said semiconductor substrate not covered by said second dummy gate structure;

forming insulator spacers on the sides of said first dummy gate structure, and on the sides of said second dummy gate structure;

forming a first heavily doped source/drain region, of a first conductivity type, in an area of said first region of said semiconductor substrate not covered by said first dummy gate structure or by said insulator spacers, and forming a second heavily doped source/drain region, of a second conductivity type, in an area of said second region of said semiconductor substrate not covered by said second dummy gate structure or by said insulator spacers;

forming a planarized, composite insulator layer, between dummy gate structures, with a top surface of said first dummy gate structure, and with a top surface of said second dummy gate structure, exposed;

selectively removing said first dummy gate structure, exposing a first channel region, located between said first lightly doped source/drain regions, and selectively removing said second dummy gate structure, exposing a second channel region, located between said second lightly doped source/drain regions;

depositing a high dielectric constant, (high k), gate insulator layer;

depositing a doped polysilicon layer;

removing a portion of said polysilicon layer from the top surface of said high k gate insulator layer, in said second region of said semiconductor substrate;

depositing a metal layer, completely filling spaces created by removal of said dummy gate structures; and removing a first portion of said metal layer, from the top surface of said high k gate insulator layer to form said second type gate structure, comprised of metal, on said high k gate insulator layer, on said second channel region in said second region of said semiconductor substrate, and removing a second portion of said metal layer, and a portion of said polysilicon layer, from the top surface of said high k gate insulator layer, to form said first type gate structure, comprised of metal-polysilicon, on said high k gate insulator layer, in said first region of said semiconductor substrate.

2. The method of claim 1, wherein said dummy gate structures are comprised of silicon nitride, at a thickness between about 2000 to 3000 Angstroms, with said dummy gate structures overlying a silicon oxide layer, formed at a thickness between about 100 to 200 Angstroms.

3. The method of claim 1, wherein said first lightly doped source/drain region, is a P type, lightly doped source/drain region, formed via ion implantation of boron or $BF_2$ ions, at an energy between about 5 to 10 KeV, at a dose between about 2E14 to 1E15 atoms/cm$^2$.

4. The method of claim 1, wherein said second lightly doped source/drain region, is an N type, lightly doped source/drain region, formed via ion implantation of arsenic or phosphorous ions, at an energy between about 5 to 10 KeV, at a dose between about 5E14 to 1E15 atoms/cm$^2$.

5. The method of claim 1, wherein said insulator spacers are comprised of silicon oxide, obtained via deposition of a silicon oxide layer, using LPCVD or PECVD procedures, at a thickness between about 600 to 800 Angstroms, then defined via an anisotropic RIE procedure, using CHF$_3$ as an etchant.

6. The method of claim 1, wherein said first heavily doped source/drain region, is a P type, lightly doped source/drain region, formed via ion implantation of boron or BF$_2$ ions, at an energy between about 20 to 30 KeV, at a dose between about 5E15 to 1E16 atoms/cm$^2$.

7. The method of claim 1, wherein said second heavily doped source/drain region, is an N type, lightly doped source/drain region, formed via ion implantation of arsenic or phosphorous ions, at an energy between about 60 to 80 KeV, at a dose between about 5E15 to 1E16 atoms/cm$^2$.

8. The method of claim 1, wherein said composite insulator layer is comprised of an underlying silicon oxide liner layer, such as a silicon rich oxide, (SRO), layer, obtained via LPCVD or PECVD procedures to a thickness between about 300 to 500 Angstroms; and an overlying layer of borophosphosilicate glass-fluorinated silica glass, or other flowable low k dielectric layers, obtained via PECVD procedures, at a thickness between about 8000 to 10000 Angstroms.

9. The method of claim 1, wherein said dummy gate structures are selectively removed using a hot phosphoric acid solution.

10. The method of claim 1, wherein said high k gate insulator layer is either a refractory metal oxide layer, such as Ta$_2$O$_5$, or a nitrided oxide layer, with a dielectric constant between about 5 to 22, obtained via CVD procedures, at a thickness between about 200 to 400 Angstroms.

11. The method of claim 1, wherein said doped polysilicon layer is obtained via LPCVD procedures at a thickness between about 4000 to 8000 Angstroms, in situ doped during deposition via the addition of arsine, or phosphine to a silane ambient.

12. The method of claim 1, wherein portion of said polysilicon layer is removed in said second region of said semiconductor substrate, via wet etch procedures, using a hot potassium hydroxide solution as an etchant.

13. The method of claim 1, wherein said metal layer is comprised of either aluminum, aluminum-copper, aluminum-copper-silicon, copper, or a transition metal, obtained via plasma vapor deposition procedures at a thickness between about 4000 to 5000 Angstroms.

14. A method of forming a metal-polysilicon gate structure, on a high k dielectric constant, (high k), gate insulator layer, for a P channel, metal oxide semiconductor, (PMOS), device, and simultaneously forming a metal gate structure, on said high k gate insulator layer, for an N channel, metal oxide semiconductor, (NMOS), device, on a semiconductor substrate, comprising the steps of:

forming a first silicon nitride dummy gate structure in a PMOS region of said semiconductor substrate, to be used for said PMOS device, and forming a second silicon nitride dummy gate structure in an NMOS region of said semiconductor substrate, to be used for said NMOS device;

forming a P type, lightly doped source/drain region in an area of said PMOS region not covered by said first silicon nitride dummy gate structure, and forming an N type, lightly doped source/drain region in an area of said NMOS region not covered by said second silicon nitride dummy gate structure;

forming silicon oxide spacers on the sides of said first silicon nitride dummy gate structure, and on the sides of said second silicon nitride dummy gate structure;

forming a P type heavily doped source/drain region in an area of said PMOS region not covered by said first silicon nitride dummy gate structure or by said silicon oxide spacers, and forming an N type heavily doped source/drain region in an area of said NMOS region not covered by said second silicon nitride dummy gate structure or by said silicon oxide spacers;

depositing a silicon oxide liner layer;

depositing a composite insulator layer filling spaces between said first silicon nitride dummy gate structure, and said second silicon nitride dummy gate structure;

planarizing said composite insulator layer, exposing a top surface of silicon nitride dummy gate structures;

selectively removing said first silicon nitride dummy gate structure, exposing a PMOS channel region located between said P type lightly doped source/drain regions, and selectively removing said second silicon nitride dummy gate structure, exposing an NMOS channel region, located between said N type lightly doped source/drain regions;

depositing a high dielectric constant, (high k), gate insulator layer;

depositing an in situ doped polysilicon layer;

performing a wet etch procedure to remove a region of said in situ doped polysilicon layer from the top surface of said high k gate insulator layer, in said NMOS region;

depositing a metal layer, completely filling spaces created by removal of said silicon nitride dummy gate structures; and performing a chemical mechanical polishing procedure to remove a first portion of said metal layer from a first portion of a top surface of said high k gate insulator layer, forming said metal gate structure, embedded in said composite insulator layer, residing on said high k gate insulator layer, in said NMOS channel region, and removing a second portion of said metal layer, and an underlying portion of said in situ doped polysilicon layer, from a second portion of a top surface of said high k gate insulator layer, forming said metal-polysilicon gate structure, embedded in said composite insulator layer, residing on said high k gate insulator layer, in said PMOS region.

15. The method of claim 14, wherein said silicon nitride dummy gate structures are formed from a silicon nitride layer, obtained via LPCVD or PECVD procedures at a thickness between about 2000 to 3000 Angstroms, and defined via an anisotropic RIE procedure, using either Cl$_2$ or CF$_4$ as an etchant for silicon nitride.

16. The method of claim 14, wherein said P type lightly doped source/drain region is formed via ion implantation of boron or BF$_2$ ions, at an energy between about 5 to 10 KeV, at a dose between about 2E14 to 1E15 atoms/cm$^2$.

17. The method of claim 14, wherein said N type lightly doped source/drain region is formed via ion implantation of arsenic or phosphorous ions, at an energy between about 5 to 10 KeV, at a dose between about 5E14 to 1E15 atoms/cm$^2$.

18. The method of claim 14, wherein said silicon oxide spacers are formed via deposition of a silicon oxide layer, using LPCVD or PECVD procedures, at a thickness between about 600 to 800 Angstroms, then defined via an anisotropic RIE procedure, using CHF$_3$ as an etchant.

19. The method of claim 14, wherein said P type heavily doped source/drain region is formed via ion implantation of boron or $BF_2$ ions, at an energy between about 25 to 30 KeV, at a dose between about 5E15 to 1E16 atoms/$cm^2$.

20. The method of claim 14, wherein said N type heavily doped source/drain region is formed via ion implantation of arsenic or phosphorous ions, at an energy between about 60 to 80 KeV, at a dose between about 5E15 to 1E16 atoms/$cm^2$.

21. The method of claim 14, wherein said silicon oxide liner is a silicon rich oxide, (SRO), layer, obtained via LPCVD or PECVD procedures, at a thickness between about 300 to 500 Angstroms.

22. The method of claim 14, wherein said composite insulator layer is comprised of an underlying layer of borophosphosilicate glass, and an overlying layer of fluorinated silica glass, or comprised of any low k flowable material, both obtained via PECVD procedures, with said composite insulator layer at a thickness between about 8000 to 10000 Angstroms.

23. The method of claim 14, wherein said composite insulator layer is planarized via a chemical mechanical polishing procedure.

24. The method of claim 14, wherein said silicon nitride dummy gate structures are selectively removed using a hot phosphoric acid solution.

25. The method of claim 14, wherein said high k gate insulator layer is a refractory metallic oxide, such as $Ta_2O_5$, or a nitrided oxide layer, with a dielectric constant between about 5 to 22, obtained via CVD, or rapid thermal oxidation procedures, at a thickness between about 200 to 400 Angstroms.

26. The method of claim 14, wherein said in situ doped polysilicon layer is obtained via LPCVD procedures at a thickness between about 4000 to 5000 Angstroms, in situ doped during deposition via the addition of arsine, or phosphine to a silane ambient.

27. The method of claim 14, wherein said wet etch procedure, used to remove a portion of said in situ polysilicon layer in said NMOS region, is accomplished using a hot potassium hydroxide solution as an etchant.

28. The method of claim 14, wherein said metal layer is comprised of either aluminum, aluminum-copper, aluminum-copper-silicon, copper, or a transition metal, obtained via plasma vapor deposition procedures at a thickness between about 4000 to 5000 Angstroms.

\* \* \* \* \*